(12) United States Patent
Chia et al.

(10) Patent No.: US 9,207,278 B2
(45) Date of Patent: Dec. 8, 2015

(54) TESTING INTEGRATED CIRCUIT PACKAGING FOR SHORTS

(71) Applicant: Texas Instruments Incorporated, Dallas, TX (US)

(72) Inventors: Hoon Siong Chia, Muar (MY); Chee Peng Ong, Ayer Keroh (MY)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 336 days.

(21) Appl. No.: 13/849,431

(22) Filed: Mar. 22, 2013

(65) Prior Publication Data

US 2014/0285229 A1    Sep. 25, 2014

(51) Int. Cl.
G01R 31/02 (2006.01)
G01R 31/30 (2006.01)
G01R 31/28 (2006.01)

(52) U.S. Cl.
CPC .................................. *G01R 31/2896* (2013.01)

(58) Field of Classification Search
CPC .................................. G01R 31/02; G01R 31/30
USPC ............. 324/762.02, 755.11, 765.04, 756.05, 324/756.04
See application file for complete search history.

(56) References Cited

U.S. PATENT DOCUMENTS

| | | | |
|---|---|---|---|
| 3,796,848 A * | 3/1974 | Southworth, Jr. | 200/175 |
| 6,710,607 B2 * | 3/2004 | Fujii et al. | 324/754.03 |
| 6,940,299 B1 | 9/2005 | Lim | |
| 7,049,842 B2 | 5/2006 | Lopezdenava | |
| 8,451,014 B2 * | 5/2013 | Black et al. | 324/754.04 |
| 2002/0135357 A1* | 9/2002 | Maassen et al. | 324/158.1 |
| 2005/0134301 A1* | 6/2005 | Lopezdenava | 324/765 |
| 2006/0038578 A1* | 2/2006 | Hashimoto | 324/765 |
| 2008/0050969 A1* | 2/2008 | Josephson | 439/608 |
| 2014/0264331 A1* | 9/2014 | Yao et al. | 257/48 |

* cited by examiner

*Primary Examiner* — Patrick Assouad
*Assistant Examiner* — Lamarr Brown
(74) *Attorney, Agent, or Firm* — Steven A. Shaw; Charles A. Brill; Frank D. Cimino

(57) ABSTRACT

An electronic package that has an array of pins may be tested for shorts and continuity in a parallel manner. The array of pins are allocated to four or more groups of pins such that each pin in each group is not adjacent to a pin from its own group of pins. One of the groups of pins is tested for continuity while placing a reference voltage level on all of the pins in the other groups of pins. A separate current source is coupled to each pin and a resultant voltage is measured. A short between one of the pins in the first group and a pin in one of the other groups can be detected when the resultant voltage on one of the pins in the first group is approximately equal to the reference voltage. Group-wise testing is repeated until all groups have been tested.

8 Claims, 5 Drawing Sheets

TESTING INTEGRATED CIRCUIT PACKAGING FOR SHORTS

FIELD OF THE INVENTION

This invention generally relates to testing packaged integrated circuits, and particular to testing a large number of pins for shorts and continuity.

BACKGROUND OF THE INVENTION

A chip scale package (CSP) is a type of integrated circuit chip carrier. In order to qualify as chip scale, the package typically has an area no greater than 1.2 times that of the die and it is a single-die, direct surface mountable package. Another criterion that is often applied to qualify these packages as CSPs is their ball pitch should be no more than 1 mm.

The die may be mounted on an interposer upon which pads or balls are formed, like with flip chip ball grid array (BGA) packaging, or the pads may be etched or printed directly onto the silicon wafer, resulting in a package very close to the size of the silicon die. Such a package is called a wafer-level chip-scale package (WL-CSP) or a wafer-level package (WLP).

BRIEF DESCRIPTION OF THE DRAWINGS

Particular embodiments in accordance with the invention will now be described, by way of example only, and with reference to the accompanying drawings.

Figure 1:
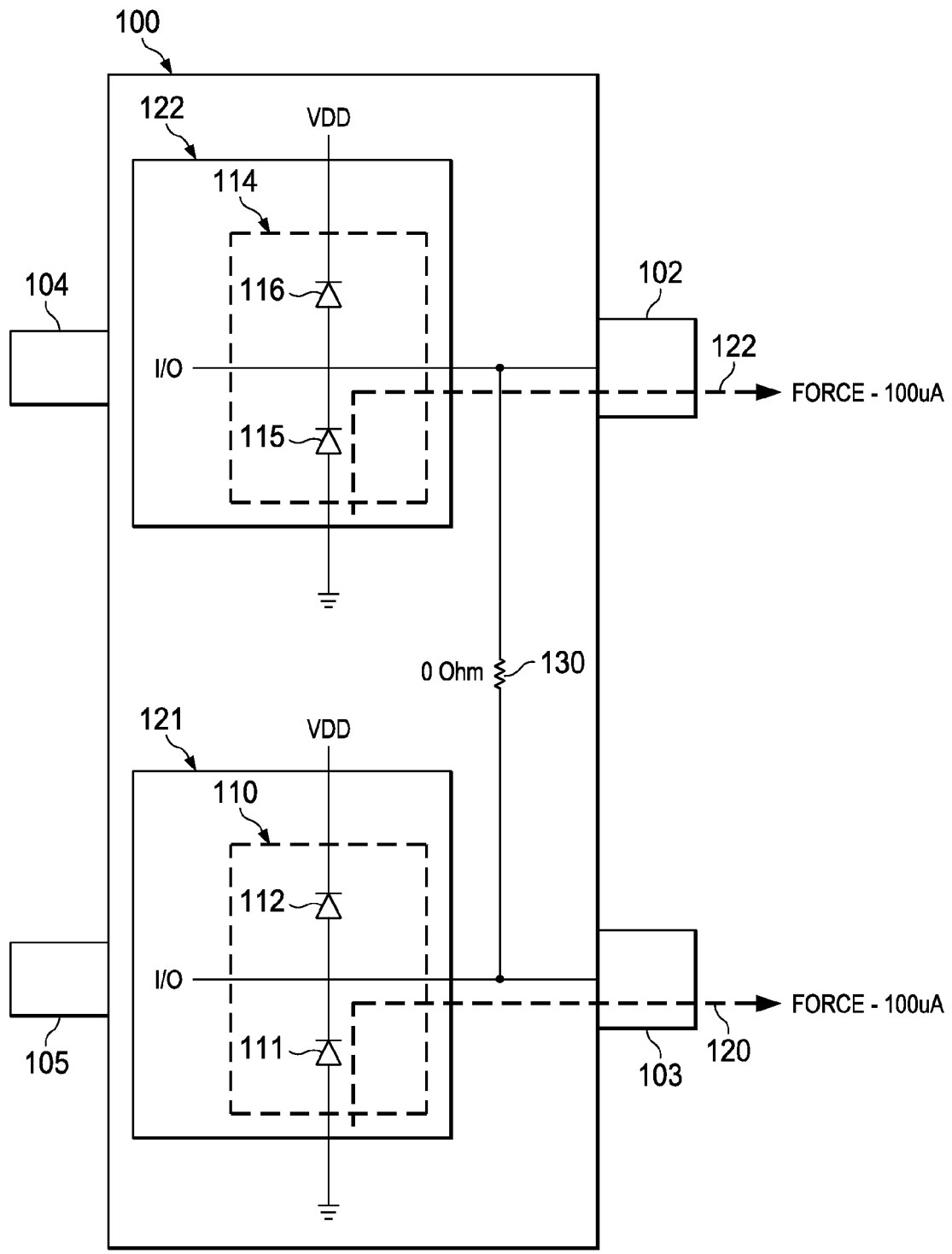
FIG. 1 is a schematic of a portion of a packaged device under test illustrating a pin to pin short that is not being detected.

Other features of the present embodiments will be apparent from the accompanying drawings and from the detailed description that follows.

DETAILED DESCRIPTION OF EMBODIMENTS OF THE INVENTION

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

A ball grid array (BGA) package, wafer-level chip-scale package (WL-CSP) and a wafer-level package (WLP) all have one thing in common; they each have a large number of densely packed pins that must be tested during production. A chip scale package (CSP) may have pins that are spaced apart by no more than 1 mm, or less. Several types of defects may occur during packaging of an integrated circuit, also referred to as a chip. For example, a pin may not be correctly connected to an interface component on the chip. Another defect may occur when an adjacent pair of pins become shorted. While it is desirable to perform production testing to detect such defects, testing each pin one at a time may take too much time; however, it is not possible to test all pins at once and detect shorts. Embodiments of the invention provide for continuity testing multiple pins in parallel to verify that they are each connected to in internal component while at the same time verifying that each pin is not shorted to an adjacent pin.

FIG. 1 is a schematic of a portion of a packaged device 100 illustrating a pin to pin short that is not being detected while packaged device 100 is being tested for continuity. Packaged device 100 may have a large number of pins, but only four pins 102-105 are illustrated in this example. Packaged device 100 includes an integrated circuit that contains various logic circuits that implement a desired function. In order to communicate with other electronic components that are external to packaged device 100, a set of interface pins is provided that are coupled to interface circuits on the integrated circuit, as is well known.

Pin interface circuits 121, 122 are representative of various types of interface circuits that may be coupled to an external package pin. For example, an interface circuit may include a receiver for receiving a signal via an interface pin from an external source. Likewise, an interface circuit may include a buffer or driver for driving a signal via an interface pin to an external destination. Some interface circuits may include both a receiver and a driver. Various known types and configurations of receivers and drivers may be implemented to handle the input and output needs of packaged device 100. Other interface circuits within packaged device 100 may be for other functions, such as coupling one or more voltage supplies and a ground reference to the integrated circuit, for example.

Regardless of the type of interface circuit, each interface circuit may include explicit or a parasitic diodes. Typically, each interface circuit may include an electrostatic discharge (ESD) protection circuit that may include diodes such as diode 111, 112 in ESD circuit 110 and diodes 115, 116 in ESD circuit 114. Due to the presence of these diodes, continuity testing on a pin may be performed by connecting a current source to each pin to force a current through a diode, such as −100 uA current 120 that is forced through diode 111 and −100 uA current 122 that is forced through diode 115. A resultant voltage is developed on the pin and may be measured. For example, when there is continuity from pin 103 to interface circuit 110, including diode 111, a voltage of approximately one diode drop will be developed on pin 103 when current 120 flows. Similarly, a voltage drop of approximately one diode drop will be developed on pin 102 when current 122 flows. If continuity does not exist, then a much larger voltage will develop on the pin with defective continuity from the current source that is trying to force a current through the pin and diode. In this manner, each pin can be tested for continuity in parallel.

A short between pins may occur during the packaging process due to contamination by conductive debris or other causes. However, when both pin 102 and 103 are tested for continuity in parallel, if a short exists between pins 102 and 103 it will not be detected since both pins will exhibit a same voltage level of approximately one diode drop as long as both have continuity.

Figure 2:
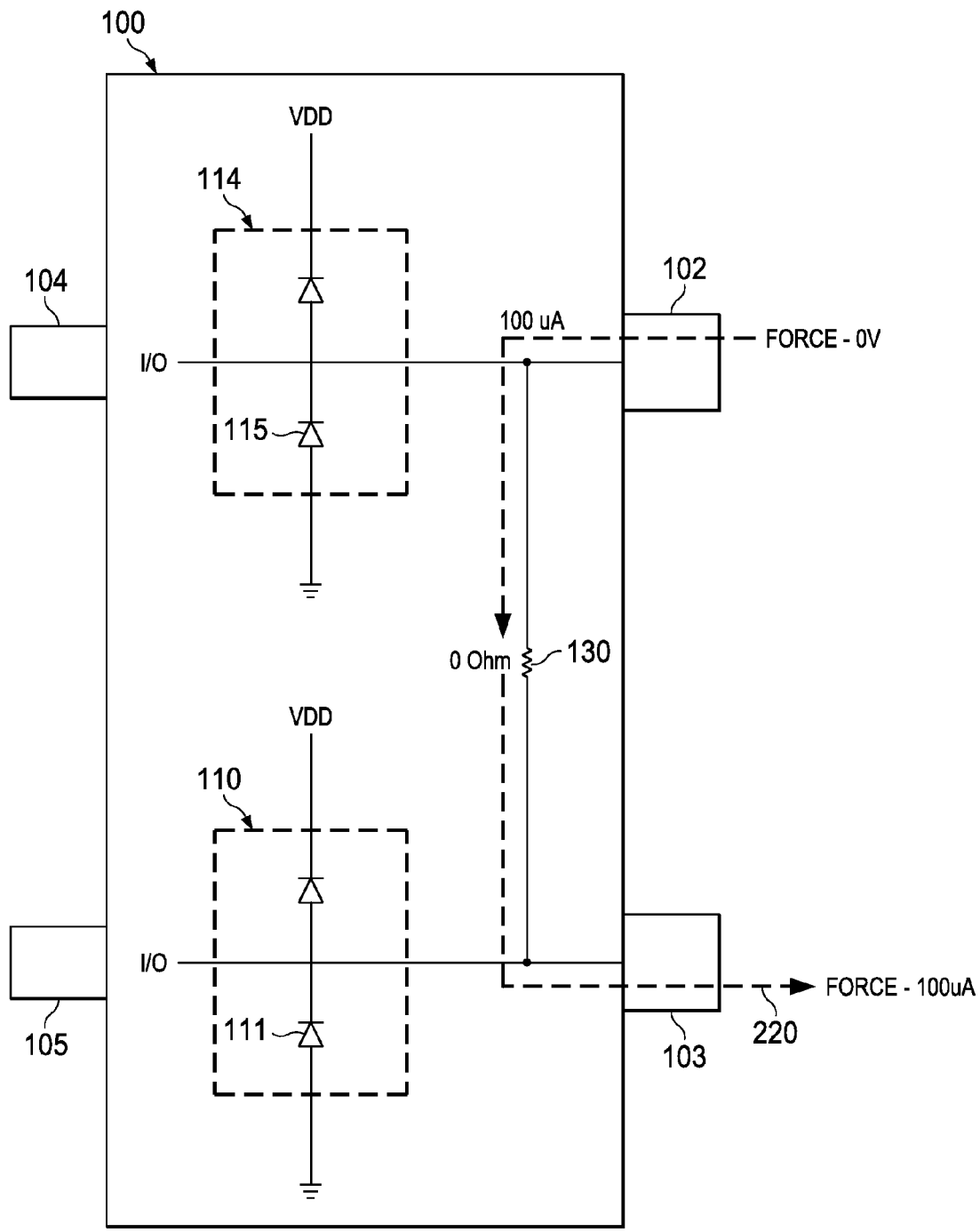
FIG. 2 is a schematic of a portion of a device under test in which a pin to pin short is correctly detected.

FIG. 2 is a schematic of a portion of a packaged device 100 under test in which a pin to pin short is correctly detected. In this case, adjacent pins 102 and 103 are not continuity tested at the same time. In this example, pin 103 is continuity tested while a reference voltage, such as zero volts, is forced onto pin 102. Short 130 will cause the reference voltage on pin 102 to be transferred to pin under test 103. Therefore, instead of detecting a voltage of approximately one diode drop on pin 103 resulting from proper continuity, a resultant voltage of approximately zero volts will be detected on pin 103 indicative of a short to pin 102. In this manner, both continuity and pin to pin shorts may be detected.

Figure 3:
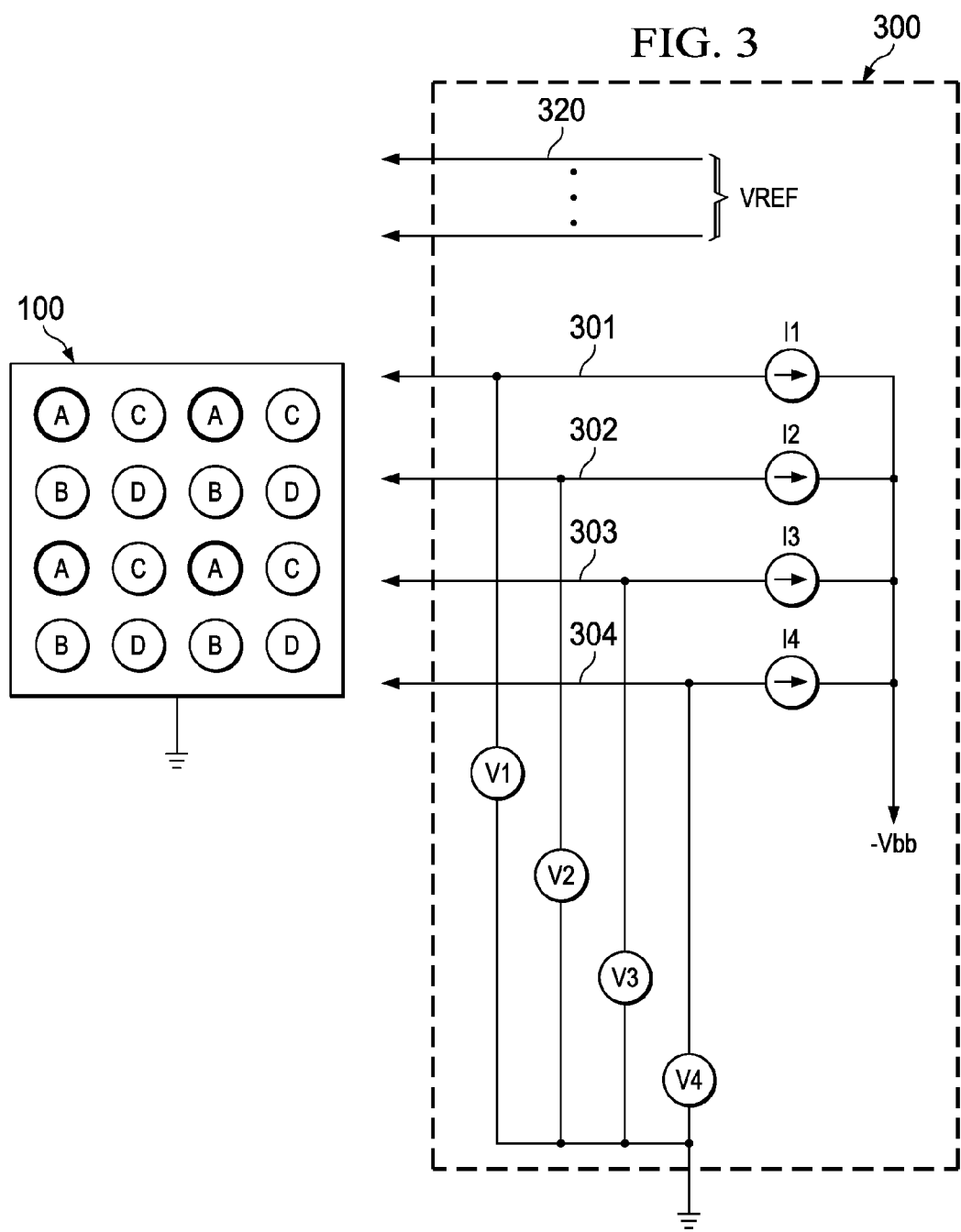
FIG. 3 is a schematic illustrating a test apparatus for testing for continuity and for shorts.

FIG. 3 is a schematic illustrating a test apparatus 300 for testing for continuity and for shorts. In this example, packaged device 100 includes sixteen pins arranged in a square array. While sixteen pins are illustrated here for clarity, packaged device 100 may include fewer or many more pins than sixteen. In order to perform continuity testing in parallel, the pins are divided into four different groups: A, B, C, and D, as illustrated. Each pin A is not adjacent to any other pin A. Similarly, pins B, C, and D are not adjacent to any other pin in their own pin group. Test apparatus 300 may now test all of the pins in the A group for continuity while placing a known voltage level (Vref), such as zero volts, on all of the pins in the other groups via probe pins 320. A separate current source, 11-14 in this example, is connected to each pin in group A via probe pins 301-304 while measuring a resultant voltage by separate voltmeters V1-V4. Thus, a short between a pin A and any pin B, C, or D will be revealed when any of voltmeters V1-V4 detects a resultant voltage approximately equal to the reference voltage rather than detecting a resultant voltage that is approximately equal to a diode drop. In the case of a discontinuity, a voltage level equal to approximately −Vbb may be detected on a defective pin.

The continuity test is performed group by group instead of serially pin by pin as in the conventional method without sacrificing the full test coverage. In this manner, testing time for continuity and short detection may be reduced.

An interconnect matrix within test apparatus 300 may be used to selectively couple the current sources, voltage meters and reference voltage to the various groups of pins of device under test 100. The interconnect matrix may be controlled by a test controller, for example.

Figure 4:
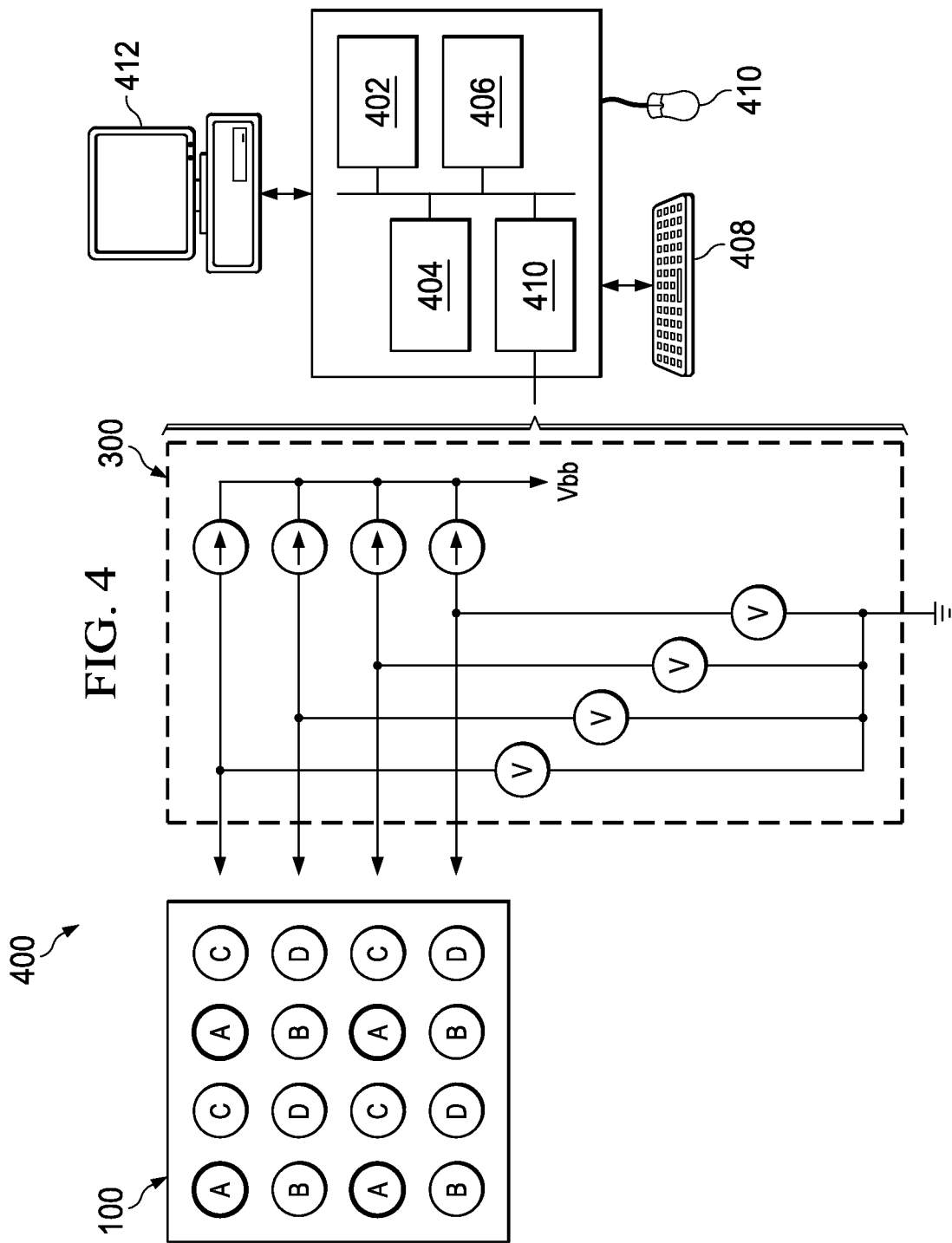
FIG. 4 is a block diagram illustrating a test system.

FIG. 4 is a block diagram illustrating a test apparatus 300 being controlled by a control system 400. Control system 400 may be a personal computer, a rack mount computer, a process control computer, or other now known or later developed control system that may be used in a production or lab environment, for example. Control system 400 includes a processor 402, associated memory 404 for holding processor executable instructions that define the test operation, a storage device 406, and numerous other elements and functionalities typical of digital systems (not shown). In one or more embodiments, a control system may include multiple processors. The digital system 400 may also include input means, such as a keyboard 408 and a mouse 410 (or other cursor control device), and output means, such as a monitor 412 (or other display device). Those skilled in the art will appreciate that the input and output means may take other forms.

The control system 400 may be connected to a network (not shown) (e.g., a local area network (LAN), a wide area network (WAN) such as the Internet, a cellular network, any other similar type of network and/or any combination thereof) via a network interface connection (not shown).

Control system 400 includes input/output logic 420 that may be controllably coupled to the various current sources and voltmeters within test apparatus 300 in order to cause test apparatus 300 to function as described above in order to perform continuity testing group by group. An interconnect matrix under control of test controller 400 may be used to selectively couple the current sources, voltage meters and reference voltage to the various groups of pins of the device under test 100.

The general concept of controlling a test apparatus with a control system and reporting defecting units under test is well known and need not be described in further detail herein. Such a test apparatus and control system may be part of a production line test bed, or may be a standalone system, for example. Techniques for connecting a test apparatus to all of the pins of a packaged device under test is also well known; for example, a test socket may be used, a "bed of nails" arrangement maybe used, etc. Similarly, techniques for selectively connecting current sources, reference voltage levels, and voltage monitoring to pins of a device under test are well known, such as by use of relays, switching devices, transfer gates, etc.

Figure 5:
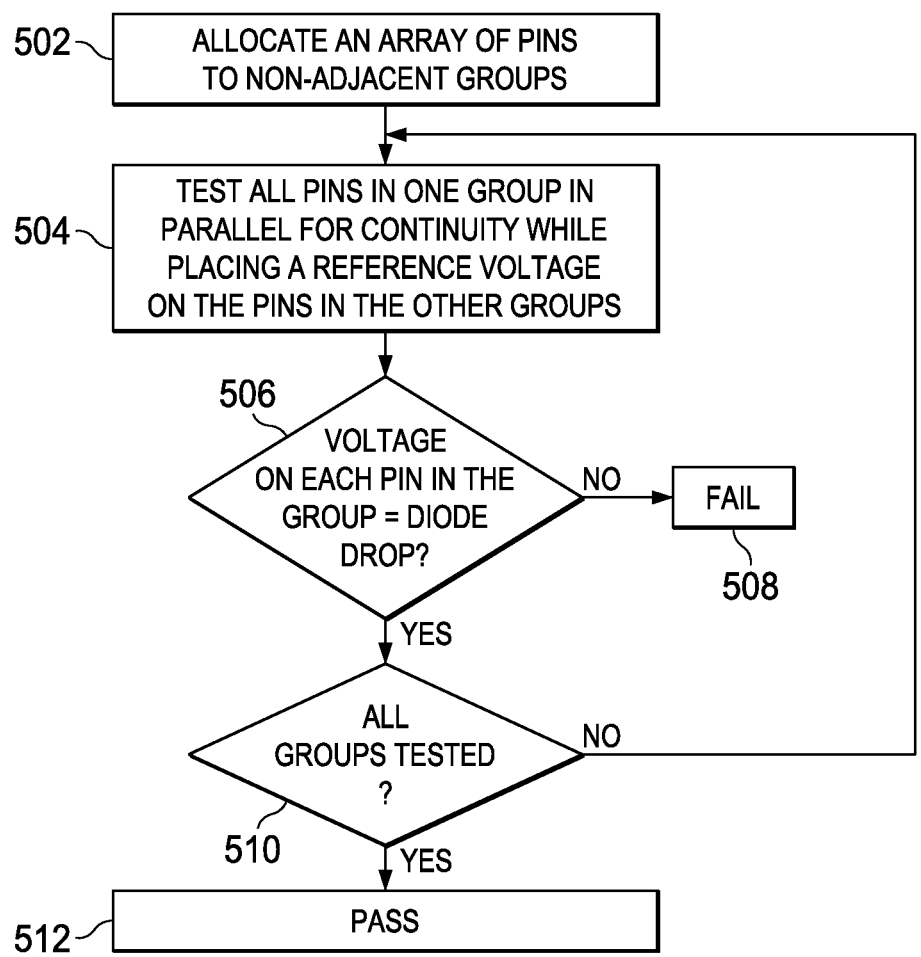
FIG. 5 is a flow chart illustrating testing a device for continuity and pin to pin shorts.

FIG. 5 is a flow chart illustrating testing an electronic package having an array of connector pins for shorts and continuity. At least a portion of the array of pins is allocated 502 to four or more groups of pins such that each pin in each group is not adjacent to a pin from its own group of pins. For example, for an array of pins arranged in square grid, four groups may be used.

All of the pins in a first one of the groups of pins are tested 504 in parallel for continuity to a corresponding electrical component within the package while placing a known reference voltage level on all of the pins in the other groups of pins. Each pin in the first group is tested for continuity by connecting a separate current source to the pin and measuring a resultant voltage on the pin.

When the resultant voltage on all of the pins is approximately equal 506 to a diode drop, then that group passes the continuity and shorts test. However, if any one of the pins in the first group does not have a resultant voltage that is approximately equal to a diode drop, then the test fails 508. A short exists between a one of the pins in the first group with a pin in one of the other groups when the resultant voltage on one of the pins in the first group is approximately equal to the known reference voltage level. A discontinuity exists when the resultant voltage on any pin in the first group has a magnitude that is significantly higher than a diode drop.

The group-wise parallel testing 504 for all pins in a group and determining 506 if a defect is present is repeated 510 for all of the groups. When all groups are tested and no defects are detected, the continuity and shorts test of the packaged device passes 512.

Other Embodiments

While the invention has been described with reference to illustrative embodiments, this description is not intended to be construed in a limiting sense. Various other embodiments of the invention will be apparent to persons skilled in the art upon reference to this description. For example, testing for continuity by forcing a current through a component may rely on an explicit diode, an intrinsic diode, multiple intrinsic diodes, resistive elements, etc. While forcing of a negative current was described herein, in some embodiments a positive current may be forced through a component, such as diode 115 in FIG. 1, to a voltage rail, such as VDD. While forcing −100 ua was illustrated herein, the amount of current is not important, as long as the current source is sufficient to turn on the diodes or other element to indicate that continuity is present.

While multiple voltmeters are illustrated herein, other embodiments may use other devices for determining voltage levels, for example: sample and hold circuits coupled to analog to digital converters, etc.

The testing techniques described in this disclosure may be implemented in hardware, software, firmware, or any combination thereof. If implemented in software, the software may be executed in one or more processors, such as a microprocessor, application specific integrated circuit (ASIC), field programmable gate array (FPGA), or digital signal processor (DSP), for example. The software that executes the techniques may be initially stored in a non-transitory computer-readable medium such as compact disc (CD), a diskette, a tape, a file, memory, or any other computer readable storage device and loaded and executed in the processor. In some cases, the software may also be sold in a computer program product, which includes the computer-readable medium and packaging materials for the computer-readable medium. In some cases, the software instructions may be distributed via removable computer readable media (e.g., floppy disk, optical disk, flash memory, USB key), via a transmission path from computer readable media on another digital system, etc.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention.

What is claimed is:

1. A method for testing an electronic package having an array of pins for shorts, the method comprising:
   selectively coupling, using an interconnect matrix, a separate one of a plurality of current sources, one of a plurality of voltage sensing devices, and a reference voltage source to each pin of the electronic package;
   allocating at least a portion of the array of pins to four or more groups of pins such that each pin in each group is not adjacent to a pin from its own group of pins;
   testing in parallel all of the pins in a first one of the groups of pins for continuity to a corresponding electrical component within the package while placing a reference voltage level on all of the pins in the other groups of pins, wherein each pin in the first group is tested for continuity by connecting via a control system the separate one of the plurality of current sources to the pin and measuring a resultant voltage on the pin; and
   determining a short exists between a one of the pins in the first group with a pin in one of the other groups when the resultant voltage on one of the pins in the first group is approximately equal to a reference voltage level of the reference voltage source.

2. The method of claim 1, further comprising repeating testing in parallel all the pins of a group and determining a short exists between a pin in a group and a pin in another group for each of the four or more groups.

3. The method of claim 1, wherein the corresponding electrical component coupled to each of the pins in the first group is a diode and continuity is indicated when the resultant voltage on each of the pins in the first group is approximately equal to a diode drop and a discontinuity is indicated when the resultant voltage is significantly higher than a diode drop.

4. A test system for testing an electronic package having an array of pins for shorts, the test system comprising:
   a plurality of current sources;
   a plurality of voltage sensing devices;
   a reference voltage source;
   an interconnect matrix configured to selectively couple a separate one of the plurality of current sources, one of the plurality of voltage sensing devices, and/or the reference voltage source to each pin of the electronic package; and
   a control system coupled to the interconnect matrix, the control system configured to:
      allocate at least a portion of the array of pins to four or more groups of pins such that each pin in each group is not adjacent to a pin from its own group of pins;
      test in parallel all of the pins in a first one of the groups of pins for continuity to a corresponding electrical component within the package while placing the reference voltage level on all of the pins in the other groups of pins, wherein each pin in the first group is tested for continuity by connecting a separate one of the current sources to the pin and measuring a resultant voltage on the pin; and
      determine a short exists between a one of the pins in the first group with a pin in one of the other groups when the resultant voltage on one of the pins in the first group is approximately equal to the reference voltage.

5. The test system of claim 4, wherein the test system is further configured to test each of the four or more groups of pins by testing in parallel all the pins of a group and determining a short exists between a pin in a group and a pin in another group.

6. The method of claim 4, wherein the corresponding electrical component coupled to each of the pins in the first group is a diode and continuity is indicated when the resultant voltage on each of the pins in the first group is approximately equal to a diode drop and a discontinuity is indicated when the resultant voltage is significantly higher than a diode drop.

7. A non-transitory computer readable medium storing software instructions that when executed by the processor, coupled to a control system having input/output logic, to perform a method for testing an electronic package having an array of pins for shorts, the method comprising:
   the input/output logic selectively coupling a separate one of a plurality of current sources, one of a plurality of voltage sensing devices, and a reference voltage source to each pin of the electronic package;
   allocating at least a portion of the array of pins to four or more groups of pins such that each pin in each group is not adjacent to a pin from its own group of pins;
   testing in parallel all of the pins in a first one of the groups of pins for continuity to a corresponding electrical component within the package while placing a reference voltage level on all of the pins in the other groups of pins, wherein each pin in the first group is tested for continuity by connecting via a control system the separate one of the plurality of current sources to the pin and measuring a resultant voltage on the pin; and determining a short exists between a one of the pins in the first group with a pin in one of the other groups when the resultant voltage on one of the pins in the first group is approximately equal to a reference voltage level of the reference voltage source.

8. The method of claim 7, further comprising repeating testing in parallel all the pins of a group and determining a short exists between a pin in a group and a pin in another group for each of the four or more groups.

* * * * *